United States Patent

Eilbeck

(10) Patent No.: US 6,905,809 B2
(45) Date of Patent: Jun. 14, 2005

(54) PHOTORESIST COMPOSITIONS

(75) Inventor: J. Neville Eilbeck, Church End Hillesden (GB)

(73) Assignee: Clariant Finance (BVI) Limited, Tortola (VG)

( * ) Notice: Subject to any disclaimer, the term of this patent is extended or adjusted under 35 U.S.C. 154(b) by 0 days.

(21) Appl. No.: 10/404,722

(22) Filed: Apr. 1, 2003

(65) Prior Publication Data

US 2004/0197696 A1 Oct. 7, 2004

(51) Int. Cl.$^7$ .............................. G03F 7/023; G03F 7/30
(52) U.S. Cl. ...................... 430/190; 430/191; 430/192; 430/193; 430/326
(58) Field of Search ................................. 430/190, 191, 430/192, 193, 326, 165

(56) References Cited

U.S. PATENT DOCUMENTS

| | | | |
|---|---|---|---|
| 3,635,709 A | 1/1972 | Kobayashi | 430/190 |
| 4,529,682 A | 7/1985 | Toukhy | 430/190 |
| 4,632,891 A | 12/1986 | Banks et al. | 430/18 |
| 4,959,292 A | 9/1990 | Blakeney et al. | 430/165 |
| 4,988,601 A | 1/1991 | Ushirogouchi et al. | 430/192 |
| 5,001,040 A | 3/1991 | Blakeney et al. | 430/326 |
| 5,145,763 A | 9/1992 | Bassett et al. | 430/169 |
| 5,238,775 A | 8/1993 | Kajita et al. | 430/192 |
| 5,279,918 A | 1/1994 | Nishi et al. | 430/190 |
| 5,290,656 A | 3/1994 | Uetani et al. | 430/165 |
| 5,413,896 A | 5/1995 | Kajita et al. | 430/192 |
| 5,422,221 A | 6/1995 | Okazaki et al. | 430/190 |
| 5,529,880 A | 6/1996 | Zampini et al. | 430/190 |
| 5,589,553 A | 12/1996 | Zampini et al. | 525/504 |
| 5,700,620 A | 12/1997 | Sakaguchi et al. | 430/191 |
| 5,932,396 A * | 8/1999 | Kamijima | 430/320 |
| 6,210,855 B1 * | 4/2001 | Ueda et al. | 430/190 |
| 6,218,069 B1 * | 4/2001 | Kato et al. | 430/190 |
| 6,242,151 B1 * | 6/2001 | Furihata et al. | 430/190 |
| 6,379,859 B2 | 4/2002 | Suzuki et al. | 430/191 |
| 6,436,601 B1 * | 8/2002 | Seth et al. | 430/190 |
| 6,451,496 B2 * | 9/2002 | Ueda et al. | 430/190 |
| 6,475,693 B1 * | 11/2002 | Susukida et al. | 430/190 |
| 6,503,682 B1 | 1/2003 | Kim et al. | 430/192 |
| 2001/0018160 A1 * | 8/2001 | Ueda et al. | 430/190 |

FOREIGN PATENT DOCUMENTS

| | | |
|---|---|---|
| EP | 0 443 533 A2 | 8/1991 |
| EP | 0 554 101 A1 | 8/1993 |
| GB | 1 227 602 | 4/1971 |
| GB | 1 546 633 | 5/1975 |
| JP | 64-35435 | 2/1989 |

OTHER PUBLICATIONS

English language translation of JP64–35435.

* cited by examiner

*Primary Examiner*—John S. Chu
(74) *Attorney, Agent, or Firm*—Alan P. Kass

(57) ABSTRACT

The present invention relates to a composition and a process for preparing a composition that comprises: 1) a film-forming novolak resin wherein the hydrogen atom of a hydroxyl group in the novolak resin is substituted with a naphthoquinonediazidosulfonyl (DNQ) group in a proportion of less than 3.0 mol % per hydrogen atom to form a partially esterified novolak resin; 2) at least one photosensitive component present in an amount sufficient to photosensitive the photoresist composition; and 3) at least one solvent.

16 Claims, 2 Drawing Sheets

Figure 1:
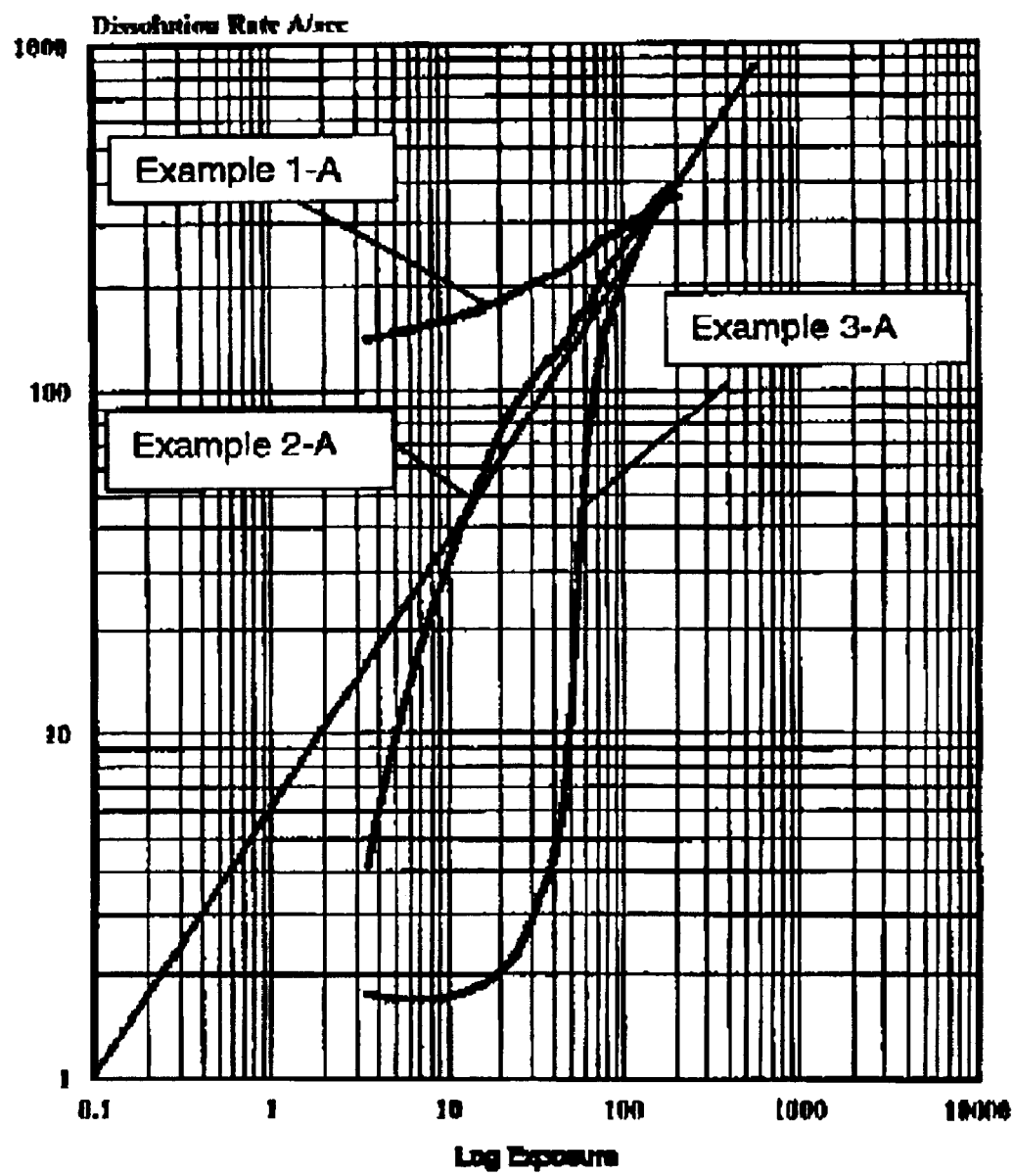
Figure 2:
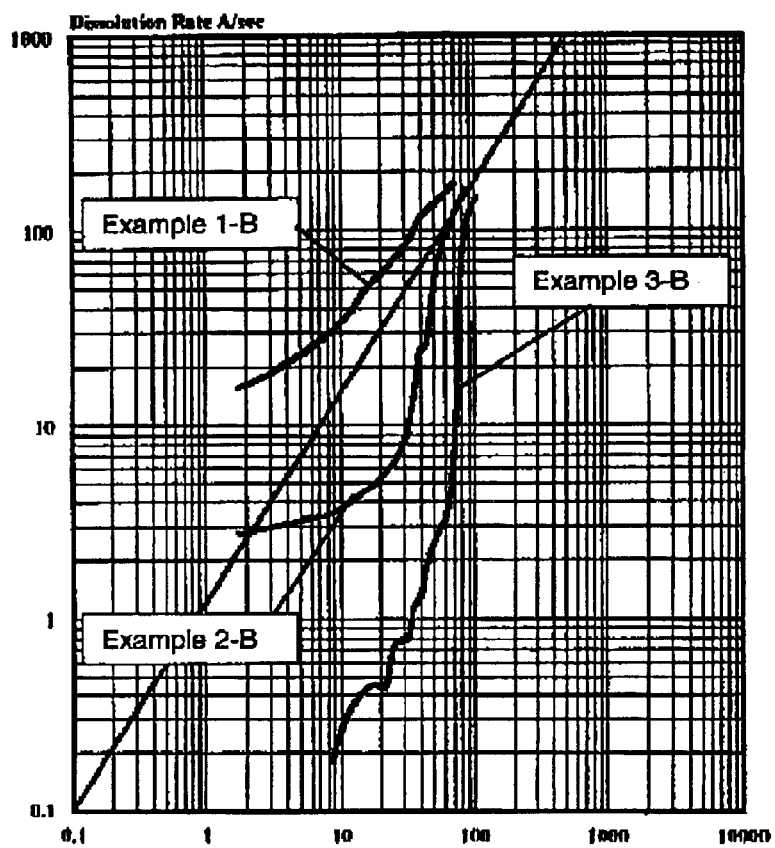

For Example 1-A, there is an insufficient amount of DNQ present within the resin to provide any acceptable solubility. For examples having higher levels of DNQ (e.g., Example 2-A), there is sufficient amount of DNQ present within the resin to provide acceptable solubility.

PHOTORESIST COMPOSITIONS

BACKGROUND OF THE INVENTION

The present invention relates to a light-sensitive photoresist composition and a process for producing such a composition. In particular, the subject invention relates to a photoresist composition comprising a partially esterified novolak resin in which a very small number of naphthoquinonediazidosulfonyl (DNQ), preferably 1,2-naphthoquinonediazidosulfonyl, molecules are attached. Such a photoresist composition requires only from 25% to 50% of the usual amount of the photoactive component required to photosensitize the composition. It provides a positive photoresist that exhibits low absorption for thicker films, good photospeed, adjustable contrast, good shelf life stability, low outgassing potential, substantially no crystallization, excellent coating properties and broadband sensitivity.

Photoresist compositions are used in microlithography processes for making miniaturized electronic components, such as in the fabrication of computer chips and integrated circuits. Generally, in these processes, a thin coating of a film of a photoresist composition is first applied to a substrate material, such as silicon wafers used for making integrated circuits. The coated substrate is then baked to evaporate any solvent in the photoresist composition and to fix the coating onto the substrate. The baked-coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed (in the case of positive photoresist) or the unexposed (in the case of negative photoresist) areas of the coated surface of the substrate.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material that corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Positive working photoresist compositions are currently favored over negative working resists because the former generally have better resolution capabilities and pattern transfer characteristics. Photoresist resolution is defined as the smallest feature that the resist composition can transfer from the photomask to the substrate with a high degree of image edge acuity after exposure and development. In many manufacturing applications today, resist resolution on the order of less than one micron is quite common. In addition, it is almost always desirable that the developed photoresist wall profiles be near vertical relative to the substrate. Such demarcations between developed and undeveloped areas of the resist coating translate into accurate pattern transfer of the mask image onto the substrate.

Efforts have been previously been made to attach DNQ groups to novolak resins. However, these efforts have been directed toward providing a resin that functions as both the film forming component and the photosensitizer. This enables the production of single component photoresists because it is not necessary to add a separate photoactive component to photosensitive the photoresist composition. One of the first patents relating to this technology was U.S. Pat. No. 3,046,120, granted 24 Jul. 1962. An ortho-cresol/formaldehyde novolak resin was esterified with a naphthoquinone-(1,2)-diazide-(2)-5-sulfonyl chloride to provide a single component photosensitive composition that useful for the production of printing plates. Other patents that relate to these attempts to combine a photosensitive compound with a phenolic resin are U.S. Pat. Nos. 3,635,709; 4,123,279 and 4,306,011.

U.S. Pat. No. 5,178,986 relates to a light sensitive mixture useful as a positive acting photoresist. The mixture contains a compound that comprises the reaction product of a DNQ and an oligomeric phenol. More recent attempts to provide a photoresist composition comprising the esterification product of a phenolic resin and a DNQ is described in U.S. Pat. No. 5,279,918, granted 18 Jan. 1994. An ortho-quinone diazide sulfonyl chloride was condensed with a relatively low molecular weight-novolak resin, wherein from 40% to 90% of the phenolic hydroxy groups were condensed with the DNQ groups. This provided a high concentration of DNQ moieties on the novolak resin backbone.

In U.S. Pat. No. 5,422,221 a photoresist composition is disclosed wherein the novolak resin serves as both the alkali-soluble film-forming resin and the photosensitive component of the composition. This is accomplished by replacing the hydrogen atom of a hydroxyl group in the novolak resin with a DNQ group in a proportion of 0.03 to 0.27 mol per hydrogen atom. It was disclosed that more than 0.27 mol % substitution results in a novolak resin that is less soluble in the photoresist solvent and that less than 0.03 mol % substitution provides a novolak resin that is too low in film retentivity so that the resulting photoresist composition cannot be patterned and is, therefore, useless.

U.S. Pat. No. 5,529,880 discloses a photoresist composition comprising: 1) the esterification product of a DNQ and a novolak resin having pendant phenol hydroxyl groups and 2) the esterification product of a phenol having 2 to 5 phenyl rings and at least 4 phenolic hydroxy groups with a DNQ having at least 50% of its phenol hydroxyl groups esterified with the DNQ. The esterification reaction to produce esterification product 1) is controlled so that a maximum of 20% of the phenolic hydroxy groups are esterified.

U.S. Pat. No. 5,723,254 discloses a positive acting photoresist composition containing a mixture of photoactive components. One component of the mixture is the esterification product of a DNQ with a low molecular weight phenolic resin.

Another component is the esterification product of a DNQ with a low molecular weight phenol having from 1 to 3 aryl rings and from 1 to 3 hydroxyl groups. A third photoactive component that may be present is the esterification product of a DNQ with a relatively high molecular weight polyhydric polynuclear phenol.

SUMMARY OF THE INVENTION

The present invention relates to a photoresist composition that comprises: a) a film-forming novolak resin wherein the hydrogen atom of a hydroxyl group in the novolak resin is substituted with a DNQ group in a proportion of less than 3.0 mol % based on the weight of the novolak resin, preferably from about 0.5% to less than 3.0% based on the weight of the novolak resin, and more preferably from about 1.5% to less than 3.0% to form a partially esterified film-forming novolak resin; b) at least one photosensitive component present in an amount sufficient to photosensitive the photoresist composition, preferably from 2.5% to 15%, based on the weight of the partially esterified novolak resin, preferably from about 5% to about 12%; and c) at least one solvent.

The film forming novolak resin that is esterified to provide the partially esterified novolak resin of the claimed photoresist composition is a water-insoluble, alkali-soluble, film forming phenolic resin preferably having a weight average molecular weight from about 1,000 to 30,000, preferably from about 1,500 to 10,000. The DNQ used for partial esterification of the novolak resin contains quinonediazide sulfonyl groups that replace the hydrogen atom of hydroxyl groups in the novolak resin. The photoactive components added to the partially esterified novolak resin may be any of those well known to those skilled in the art and include, among others, those described herein. The solvent suitable for use in present invention may be any of those well known to those skilled in the art, but preferably is a solvent or solvent blend that can be selected from 2-heptanone, either alone or in combination with anisole; ethyl lactate, either alone or in combination with n-butyl acetate or propylene glycol methyl ether; or propylene glycol methyl ether, either alone or in combination with ethyl 3-ethoxypropionate.

The invention further comprises a process of forming an image on a substrate. The substrate is coated with a film of the photoresist composition of the instant invention. The photoresist film is imagewise exposed through a mask with ultraviolet radiation and processed in accordance with those steps known to those skilled in the art.

DETAILED DESCRIPTION OF THE INVENTION

The present invention relates to a photoresist composition that comprises: a) a film-forming novolak resin wherein the hydrogen atom of a hydroxyl group in the novolak resin is substituted with a DNQ group in a proportion of less than 3.0 mol % based on the weight of the novolak resin, preferably from about 0.5% to less than 3.0% based on the weight of the novolak resin, and more preferably from about 1.5% to less than 3.0% to form a partially esterified film-forming novolak resin; b) at least one photosensitive component present in an amount sufficient to photosensitive the photoresist composition, preferably from 2.5% to 15%, based on the weight of the partially esterified novolak resin, preferably from about 5% to about 12%; and c) at least one solvent.

The film forming novolak resin that is esterified to provide the partially esterified novolak resin of the claimed photoresist composition is a water-insoluble, alkali-soluble, film forming phenolic resin preferably having a weight average molecular weight from about 1,000 to 30,000, preferably from about 1,500 to 10,000. The DNQ used for partial esterification of the novolak resin contains quinonediazide sulfonyl groups that replace the hydrogen atom of hydroxyl groups in the novolak resin. The photoactive components added to the partially esterified novolak resin may be any of those well known to those skilled in the art and include, among others, those described herein. The solvent suitable for use in photoresists may be any of those well known to those skilled in the art, but preferably is a solvent or solvent blend that can be selected from 2-heptanone, either alone or in combination with anisole; ethyl lactate, either alone or in combination with n-butyl acetate or propylene glycol methyl ether; or propylene glycol methyl ether, either alone or in combination with ethyl 3-ethoxypropionate.

The invention further comprises a process of forming an image on a substrate. The substrate is coated with a film of the photoresist composition of the instant invention. The photoresist film is imagewise exposed through a mask with ultraviolet radiation and processed in accordance with those steps known to those skilled in the art.

The partially esterified film-forming novolak resin of the claimed photoresist composition is useless, by itself, in formulating a one-component photoresist similar to those described in the prior art above. However, the addition of a low level of DNQ groups, as defined above, reduces the amount of the photosensitive component that is required to photosensitize the photoresist composition to about 25% to 50% of the amount required for the same photoresist composition, wherein the novolak resin does not have any of the hydrogen atoms of its hydroxyl groups replaced with a DNQ group.

The novolak resin that is partially esterified according to the present invention is prepared by subjecting a phenol or a substituted phenol to an addition-condensation reaction of a phenol or substituted phenol (or a combination thereof) and an aldehyde or ketone (or a combination thereof), in the presence of an acid or a divalent metal salt catalyst, in a suitable reaction solvent, as are well known to one skilled in the art of photoresists. Suitable phenols include, but are not limited to, phenol, chlorophenols, fluorophenols, m-cresol, o-cresol, p-cresol, m-ethyl phenol, o-ethyl phenol, p-ethyl phenol, m-butyl phenol, o-butyl phenol, p-butyl phenol, trimethylsilylphenol, chloromethylphenol 2,3-xylenol, 2,4-xylenol, 2,5-xylenol, 2,6-xylenol, 3,4-xylenol, 3,5-xylenol, 3,6-xylenol, o-phenyl phenol, m-phenyl phenol, p-phenyl phenol, 2,3,5-trimethylphenol, 2,3,5-triethylphenol, 3,4,5-trimethylphenol, 4-tert-butylphenol, 3-tert-butylphenol, 2-tert-butylphenol, 2-tert-butyl-4-methylphenol, 2-tert-butyl-5-methylphenol and other alkyl-substituted phenols;

p-methoxyphenol, m-methoxyphenol, o-methoxyphenol, p-ethoxyphenol, m-ethoxyphenol, o-ethoxyphenol, o-propoxyphenol, p-propoxyphenol, propoxyphenol and other alkoxy-substituted phenols; o-isopropenylphenol, p-isopropenylphenol, 2-methyl-4-isopropenylphenol, 2-ethyl-4-isopropenylphenol and other isopropenyl-substituted phenols: phenylphenol and other aryl-substituted phenols; 4,4'-dihydroxybiphenyl, bisphenol A, hydroquinone, resorcinol, 2-methyl resorcinol, 5-methyl resorcinol, pyrogallol, catechol, and other polyhydroxyphenols, as are well known to those skilled in the photoresist art. These phenols may be used either alone or in an admixture of two or more, depending upon the dissolution rate desired.

As for examples of the aldehyde, there may be used, either alone or in combination, those such as formaldehyde, paraformaldehyde, acetaldehyde, benzaldehyde, furfural, trioxane, propionaldehyde, butylaldehyde, trimethylacetaldehyde, acrolein (acrylaldehyde), crotonaldehyde, cyclohexanaldehyde, furylacrolein, terephthalaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde, and cinnamaldehyde, and the like.

Examples of the ketones include acetone, methyl ethyl ketone, diethyl ketone and diphenyl ketone. Each of these ketones may be used singly or in combination. Further, an optional combination of any of aldehydes and any of ketones can be employed.

As the acid catalyst, there may be utilized inorganic acids such as hydrochloric acid, nitric acid, sulfuric acid and the like, organic acids such as formic acid, oxalic acid, maleic acid and the like, and divalent inorganic metal salts of copper, cobalt, magnesium, manganese, nickel, zinc and the like. The reaction solvent is normally a hydrophilic solvent, such as methanol or dioxane. Preferred alkali-soluble, film forming novolak resins include phenol-formaldehyde novolaks, cresol-formaldehyde novolaks, and phenol-modified xylenol-formaldehyde novolaks.

According to the present invention, a novolak resin is partially esterified by replacing a small number of the hydrogen atoms of its hydroxyl groups (in a proportion of less than 3.0 mol % per hydrogen atom, preferably from about 0.5% to less than 3.0% based on the weight of the novolak resin, and more preferably from about 1.5% to less than 3.0%) with a compound containing a DNQ group. Examples of suitable DNQ groups include a 1,2-naphthoquinonediazide-4-sulfonyl group, a 1,2-naphthoquinonediazide-5-sulfonyl group, a 7-methyl-1,2-naphthoquinonediazide-4-sulfonyl group, a 2,1-naphthoquinonediazide-4-sulfonyl group, a 2,1-naphthoquinonediazide-5-sulfonyl group, a 2,1-naphthoquinonediazide-6-sulfonyl group, a 2,1-naphthoquinonediazide-7-sulfonyl group, and a 2,1-naphthoquinonediazide-8-sulfonyl group. These DNQ groups may be utilized alone or in combination, but the 1,2-naphthoquinonediazide-4-sulfonyl group and 1,2-naphthoquinonediazide-5-sulfonyl group are particularly preferred.

The solvent utilized in the composition of the present invention includes, for example, solvents such a glycol ether derivative such as ethyl cellosolve, methyl cellosolve, propylene glycol monomethyl ether, diethylene glycol monom- ethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxy-carboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof. The preferred solvent or solvent blend can be selected from 2-heptanone, either alone or in combination with anisole; ethyl lactate, either alone or in combination with n-butyl acetate or propylene glycol methyl ether; or propylene glycol methyl ether, either alone or in combination with ethyl 3-ethoxypropionate. When used in combination, the mixing weight ratio is usually from about 10:0 to about 0:10, more preferably from about 9:1 to about 7:3. A preferred solvent is a combination of solvents which can be selected from propylene glycol methyl ether and ethyl 3-ethoxypropionate; 2-heptanone and anisole; or ethyl lactate and n-butyl acetate.

The photosensitive component may be one or more of those components known to those skilled in the art. One example of the photosensitive component includes (1) a reaction product between a naphthoquinonediazidesulfonyl halide (for example, 1,2-naphthoquinonediazide-5-sulfonyl halide, 7-methyl-1,2-naphthoquinonediazide-4-sulfonyl halide, 2,1-naphthoquinonediazide-4-sulfonyl halide, 2,1-naphthoquinonediazide-6-sulfonyl halide, 2,1-naphthoquinonediazide-7-sulfonyl group, and 2,1-naphthoquinonediazide-8-sulfonyl halide) or benzoquinonediazidesulfonyl halide to react with a low-molecular or high-molecular compound having at least one functional group capable of condensation reaction with these sulfonyl halides. The functional group that can be condensed with a sulfonyl halide includes a hydroxyl group, an amino group, and the like. Among these, a hydroxyl group is particularly preferable and two hydroxyl groups are more preferred. The compounds containing a hydroxyl group include, for example, hydroquinone; resorcinol; phenol, p-methoxyphenol, dimethylphenol, bisphenol A, naphthol, pyrocatechol, pyrogallol monomethyl ether, pyrogallol-1,3-dimethyl ether, gallic acid, partially esterified or partially etherified gallic acid and other phenols; 2,4-dihydroxybenzophenone, 2,3,4-trihydroxybenzophenone, 2,4,6-trihydroxybenzophenone, 2,4,4'-trihydroxybenzophenone, 2,3,4,4'-tetrahydroxybenzophenone, 2,2',4,4'-tetrahydroxybenzophenone and 2,2',3,4,6'-pentahydroxybenzophenone, 2,3',4,4',6-pentahydroxybenzophenone, 2,2',3,4,4'-pentahydroxybenzophenone, 2,2',3,4,5'-pentahydroxybenzophenone, 2,3',4,5,5'-pentahydroxybenzophenone, 2,3,3',4,4',5'-hexahydroxybenzophenone and other polyhydroxybenzophenones; hydroxyphenylalkanes such as bis(2,4-dihydroxyphenyl)methane, bis(2,3,4-trihydroxyphenyl)methane and bis(2,4-dihydroxyphenyl)propane; hydroxytriphenylmethanes such as 4,4',3",4"-tetrahydroxy-3,5,3',5'-tetramethylphenylmethane and 4,4',2",3",4"-pentahydroxy-3,5,3',5'-tetramethyltriphenylmethane; bis[3-(3,5-dimethyl-4-hydroxybenzyl)-4-hydroxy-5-methylphenyl]methane, bis[3-(3,5-dimethyl-4-hydroxybenzyl)-4-hydroxy-5-ethylphenyl]methane, bis[3-(3,5-diethyl-4-hydroxybenzyl)-4-hydroxy-5-methylphenyl]methane, bis[3-(3,5-diethyl-4-hydroxybenzyl)-4-hydroxy-5-ethylphenyl]methane and other terminal xylenol linear tetranuclear compounds; 2,4-bis[2-hydroxy-3-(4-hydroxybenzyl)-5-methylbenzyl]-6-cyclohexylphenol, 2,4-bis[4-hydroxy-3-(4-hydroxybenzyl)-5-methylbenzyl]-6-cyclohexylphenol and other linear pentanuclear compounds and other linear polyphenolic compounds; bis[2-hydroxy-3-(3,5-dimethyl-4-hydroxybenzyl)-5-methylphenyl]methane, bis[2-hydroxy-3-(2-hydroxy-5-methylbenzyl)-5-methylphenyl]methane, bis[4-hydroxy-3-(2-hydroxy-5-methylbenzyl)-5-methylphenyl]methane, bis[2,5-dimethyl-3-(4-hydroxy-5-methylbenzyl)-4-hydroxyphenyl]methane, bis[2,5-dimethyl-3-(4-hydroxybenzyl)-4-hydroxyphenyl]methane, bis[2,5-dimethyl-3-(2-hydroxybenzyl)-4-hydroxyphenyl]methane and other linear tetranuclear compounds; 1,1-bis(4-hydroxyphenyl-1-[4-(4-hydroxybenzyl)phenyl]ethane, 1,1-bis(3,5-dimethyl-4-hydroxyphenyl-1-[4-(4-hydroxybenzyl)phenyl]ethane, 1,1-bis(3,5-dimethyl-2-hydroxyphenyl)-1-[4-(4-hydroxybenzyl)phenyl]ethane, 1,1-bis(4-hydroxy-3-methylphenyl)-1-[4-(4-hydroxybenzyl)phenyl]ethane, 1,1-bis(2,6-methyl-4-hydroxyphenyl)-1-[4-(4-hydroxybenzyl)phenyl]ethane, 1,1-bis(3,4-dihydroxyphenyl)-1-[4-(4-hydroxybenzyl)phenyl]ethane, 1,1-bis(3,4,5-trihydroxyphenyl)-1-[4-(4-hydroxybenzyl)phenyl]ethane, 1,1-bis(4-hydroxyphenyl)-1-[4-[1-(4-hydroxyphenyl)-1-methylethyl]phenyl]ethane, 1,1-bis(3,5-dimethyl-4-hydroxyphenyl)-1-[4-[1-(4-hydroxyphenyl)-1-methylethyl]phenyl]ethane, 1,1-bis(3,5-dimethyl-2-hydroxyphenyl)-1-[4-[1-(4-hydroxyphenyl)-1-methylethyl]phenyl]ethane, 1,1-bis(4-hydroxy-3-methylphenyl)-1-[4[1-(4-hydroxyphenyl)-1-methylethyl] phenyl]ethane, 1,1-bis(2,6-dimethyl-4-hydroxyphenyl)-1-[4-[1-(4-hydroxyphenyl-1-methylethyl)phenyl]ethane, 1,1-bis(3,4-dihydroxyphenyl)-1-[4-[1(4-hydroxyphenyl)-1-methylethyl]phenyl]ethane, 1,1-bis(3,4,5-trihydroxyphenyl)-1-[4-(1-(4-hydroxyphenyl)-1-methylethyl]phenyl]ethane, and other non-linear tetranuclear compounds; bis(4-hydroxy-2,3,5-trimethylphenyl)-2-hydroxyphenylmethane, 1,4-bis[1-(3,5-dimethyl-4-hydroxyphenyl)isopropyl]benzene, 2,4-bis(3,5-dimethyl-4-hydroxyphenylmethyl)-6-methylphenol, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-[4-[1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy-4-hydroxyphenylmethyl)pyrogallol, 4,6-bis(3,5-dimethyl-4-hydroxyphenylmethyl)pyrogallol, 2,6-bis(3-methyl-4,6-dihydroxyphenylmethyl)-4-methylphenol, 2,6-bis(2,3,4-trihydroxyphenylmethyl)-4-methylphenol, 1,1-bis(4-hydroxyphenyl)cyclohexane and other hydroxyaryls.

Another example includes (2) the compounds shown in formulae (I) and (II) below:

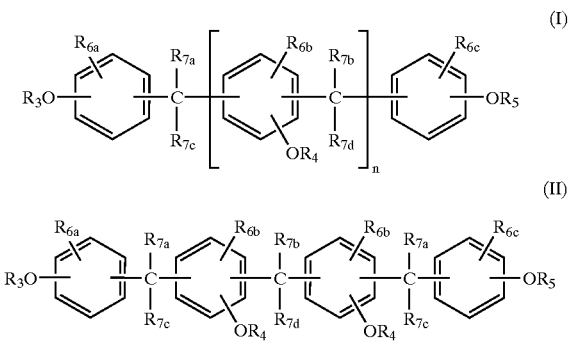

wherein $R_3$, $R_4$ and $R_5$ are independently selected from the group consisting of a hydrogen atom, a 1,2-naphthoquinonediazide-4-sulfonyl group, a 1,2-naphthoquinonediazide-5-sulfonyl group, a 7-methyl-1,2-naphthoquinonediazide-4-sulfonyl group, a 2,1-naphthoquinonediazide-4-sulfonyl group, a 2,1-naphthoquinonediazide-6-sulfonyl group, a 2,1-naphthoquinonediazide-7-sulfonyl group, a 2,1-naphthoquinonediazide-8-sulfonyl group, and mixtures thereof, and $R_3$, R4 and $R_5$ cannot be a hydrogen atom at the same time, $R_{6a}$, $R_{6b}$, $R_{6c}$, $R_{7a}$, $R_{7b}$, $R_{7c}$, and $R_{7d}$ are independently selected from a hydrogen atom or $C_{1-4}$ alkyl group, and n represents 1 or 2. See, for example, U.S. Pat. No. 6,503,682.

Examples of compounds of formula (II) include

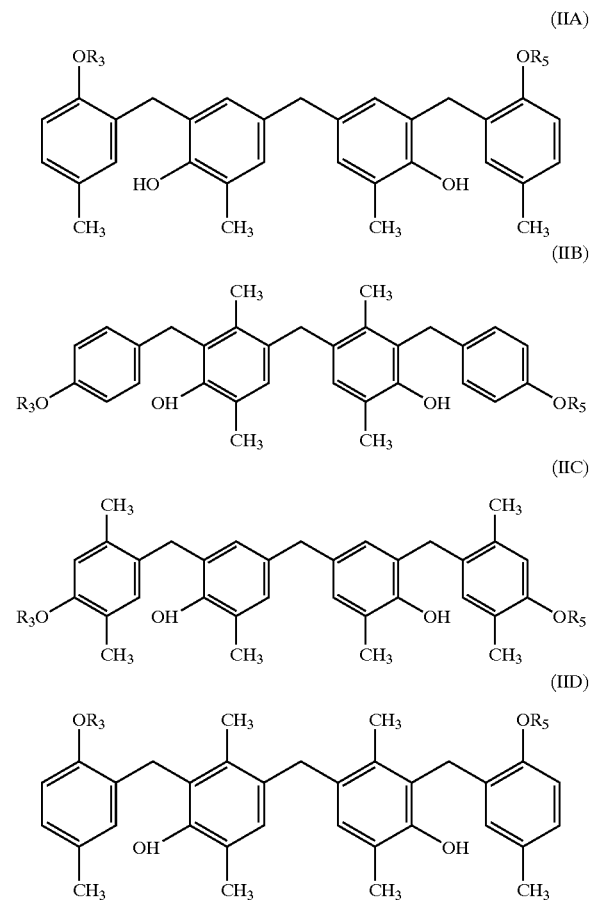

where $R_3$ and $R_5$ are not hydrogen.

Some preferred examples of compounds of formula (II) include

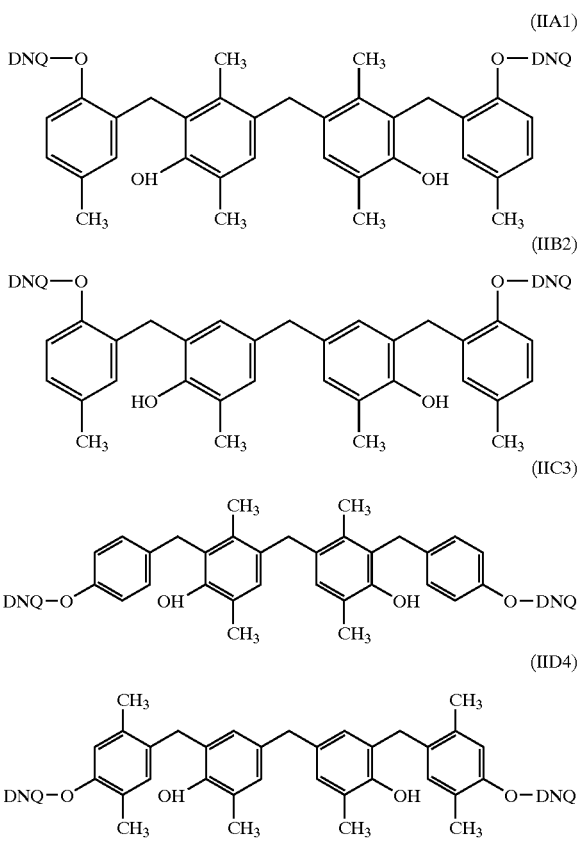

The compositions of the present invention contain from about 2.5% to 15%, based on the weight of the partially esterified novolak resin, preferably from about 5% to about 12% of the one or more photosensitive component.

According to the present invention, a film-forming novolak resin is modified by replacing a small portion of the hydrogen atoms of the hydroxyl groups of the novolak with a DNQ group, in a proportion of less than 3.0 mol % per hydrogen atom, preferably from about 0.5% to less than 3.0% based on the weight of the novolak resin, more preferably from about 1.5% to less than 3.0%. The partially esterified novolak resin is utilized as the film-forming resin in a photoresist composition. Such a photoresist composition requires only from 25% to 50% of the usual amount of the photoactive component required to photosensitive the composition if the novolak resin is not partially esterified with a DNQ, according to the present invention.

In addition, in a more preferred embodiment of the present invention, the use of the most preferred photoresist solvent mixtures provides a photoresist composition capable of forming a film of the desired thickness on a substrate at a much lower solids level in the photoresist composition. The solids level includes the partially esterified novolak resin, the photoactive component, and optional solid additives.

The photoresist composition may also contain various additives well known to those skilled in the art, such as dyes, pigments, and surface-active agents. Examples of surface-active agents include fluorine-containing surface-active agents. The photoresist composition of the present invention is prepared by dissolving the partially esterified novolak resin and the photoactive component in the photoresist solvent in an amount sufficient to from a film of the desired thickness by coating onto a suitable substrate. A microelectronic device may then be prepared by coating (e.g., spin coating) the photoresist onto a suitable substrate, such as a silicon wafer that has been treated with hexamethyldisilazane (HMDS), pre-baking the coated substrate at a suitable temperature to substantially remove the photoresist solvent, then exposing the coated substrate to a suitable wavelength of actinic radiation through a mask pattern, then developing the exposed photoresist composition with a suitable developer such as a tetramethylammonium hydroxide, washing and then drying the coated and patterned substrate.

Examples of the present invention are set forth below, by way of illustration and not limitation. Unless otherwise noted, all parts and percentages herein are by weight; molecular weight is weight average molecular weight, all temperatures are degrees Centigrade.

EXAMPLES

A novolak resin (m-cresol:p-cresol; 4:6 parts with formaldehyde) was esterified to 2 mol % with 1,2-naphthoquinonediazide-4-sulfonyl as the DNQ group and was then solubilized to 25% active solids in a solvent blend of propylene glycol methyl ether:ethyl 3-ethoxypropionate (8:2) (hereinafter Resin A).

Five aliquots of Resin A were used to make the following formulations:

| Formulation 1 | |
|---|---|
| Resin A (25% active solids) | 23.0 grams |
| PAC-1 (25% active solids) | 2.0 grams |
| Organosilane (5% active solids) | ~0.5 grams |
| Formulation 2 | |
| Resin A (25% active solids) | 23.0 grams |
| PAC-2 (25% active solids) | 3.0 grams |
| Organosilane (5% active solids) | ~0.5 grams |
| Formulation 3 | |
| Resin A (25% active solids) | 23.0 grams |
| PAC-3 (25% active solids) | 3.0 grams |
| Organosilane (5% active solids) | ~0.5 grams |
| Formulation 4 | |
| Resin A (25% active solids) | 23.0 grams |
| PAC-4 (25% active solids) | 3.0 grams |
| Organosilane (5% active solids) | ~0.5 grams |
| Formulation 5 | |
| Resin A (25% active solids) | 23.0 grams |
| PAC-1 (25% active solids) | 3.0 grams |
| Organosilane (5% active solids) | ~0.5 grams |

The PACs used are shown below (where DNQ is 2,1-naphthoquinonediazide-5-sulfonyl-; PACs are solublized in a solvent blend of propylene glycol methyl ether ethyl 3-ethoxypropionate (8:2); see, for example, U.S. Pat. No. 6,503,682 for methods to make these PACs):

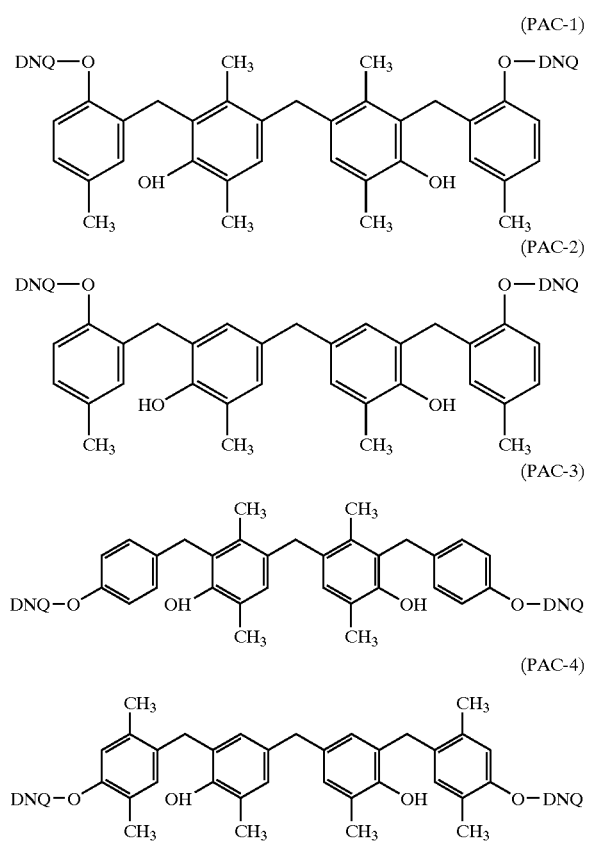

Each of Formulations 1 to 5 was applied to a silicon wafers at 4,000 rpm and then soft-baked on a proximity hotplate oven at 90° C. for about 90 seconds to form a film thickness of 2.0 cm for Formulation 1 and a film thickness of 1.2 μm for Formulations 2 to 5. Actinic exposure was applied using a ASML i-250 stepper through a glass photomask containing a resolution test pattern. The coated wafers were exposed at varying doses ranging as follows:

For Formulation 1: from 95 mJ/cm$^2$ to 120 mJ/cm$^2$ with nominal exposure for 0.7 μm being 105 mJ/cm$^2$;

For Formulation 2: from 55 mJ/cm$^2$ to 75 mJ/cm$^2$ with nominal exposure for 0.5 μm being 65 mJ/cm$^2$.

For Formulation 3: from 125 mJ/cm$^2$ to 140 mJ/cm$^2$ with nominal exposure for 0.5 μm being 125 mJ/cm$^2$.

For Formulation 4: from 130 mJ/cm$^2$ to 155 mJ/cm$^2$ with nominal exposure for 0.5 μm being 140 mJ/cm$^2$.

For Formulation 5: from 195 mJ/cm$^2$ to 210 mJ/cm$^2$ with nominal exposure for 0.5 μm being 195 mJ/cm$^2$.

After exposure, the wafers were post exposure baked on a proximity hot plate at 110° C. for about 90 seconds, The wafers were subsequently developed with AZ 300 MIF Developer using a single puddle at 23° C. for about 60 seconds.

The above Formulations resulted in good lithographic performance with improved resolution and profile.

While described in terms of the presently preferred embodiments, it is to be understood that the present disclosure is to be interpreted as by way of illustration, and not by way of limitation, and that various modifications and alterations apparent to one skilled in the art may be made without departing from the scope and spirit of the present invention.

What is claimed is:

1. A composition comprising: a) a film-forming novolak resin wherein the hydrogen atoms of hydroxyl groups in said novolak resin are substituted by a naphthoquinonediazidosulfonyl in a proportion of less than 3.0 mol % based on the weight of the novolak resin to form a partially esterified film-forming novolak resin; b) at least one photosensitive component in an amount sufficient to photosensitize said photoresist composition; and c) at least one solvent.

2. The composition of claim 1 wherein for a) the naphthoquinonediazidosulfonyl group is selected from 1,2-naphthoquinonediazide-4-sulfonyl group, a 1,2-naphthoquinonediazide-5-sulfonyl group, a 7-methyl-1,2-naphthoquinonediazide-4-sulfonyl group, a 2,1-naphthoquinonediazide-sulfonyl group, a 2,1-naphthoquinonediazide-6-sulfonyl group, a 2,1-naphthoquinonediazide-7-sulfonyl group, and a 2,1-naphthoquinonediazide-sulfonyl group.

3. The composition of claim 2 wherein for a) the naphthoquinonediazidosulfonyl group is a 1,2-naphthoquinonediazide-4-sulfonyl group or a 1,2-naphthoquinonediazide-5-sulfonyl group.

4. The composition of claim 1 wherein for a) the naphthoquinonediazidosulfonyl group is present in a proportion of from about 0.5% to less than 3.0%, based on the weight of the partially esterified novolak resin.

5. The composition of claim 4 wherein for a) the naphthoquinonediazidosulfonyl group is present in a proportion of from about 1.5% to less than 3.0%, based on the weight of the partially esterified novolak resin.

6. The composition of claim 1 wherein b) the photosensitive component is selected from a reaction product between a naphthoquinonediazidesulfonyl halide or benzoquinonediazidesulfonyl halide and a compound containing at least one hydroxyl group selected from hydroquinone; resorcinol: phenol, p-methoxyphenol, dimethylphenol, bisphenol A, naphthol, pyrocatechol, pyrogallol monomethyl ether, pyrogallol-1,3-dimethyl ether, gallic acid, partially esterified or partially etherified gallic acid and other phenols; 2,4-dihydroxybenzophenone, 2,3,4-trihydroxybenzophenone, 2,4,6-trihydroxybenzophenone, 2,4,4'-trihydroxybenzophenone, 2,3,4,4'-tetrahydroxybenzophenone, 2,2',4,4'-tetrahydroxybenzophenone, 2,2',3,4,6'-pentahydroxybenzophenone, 2,3',4,4',6-pentahydroxybenzophenone, 2,2',3,4,4'-pentahydroxybenzophenone, 2,2',3,4,5'-pentahydroxybenzophenone, 2,3',4,5,5'-pentahydroxybenzophenone, 2,3,3',4,4',5'-hexahydroxybenzophenone and other polyhydroxybenzophenones; bis(2,4-dihydroxyphenyl)methane, bis(2,3,4-trihydroxyphenyl)methane, bis(2,4-dihydroxyphenyl)propane and other hydroxyphenylalkanes; 4,4',3",4"-tetrahydroxy-3,5,3',5'-tetamethylphenylmethane, 4,4',2",3",4"-pentahydroxy-3,5,3',5'-tetramethyltriphenylmethane and other hydroxytriphenylmethanes; bis[3-(3,5-dimethyl-4-hydroxybenzyl)-4-hydroxy-5-methylphenyl]methane, bis[3-(3,5-dimethylhydroxybenzyl-4-hydroxy-5-ethylphenyl]methane, bis[3-(3,5-diethyl-4-hydroxybenzyl)-4-hydroxy-5-methylphenyl]methane, bis[3-(3,5-diethyl-4-hydroxybenzyl)-4-hydroxy-5 ethylphenyl]methane and other terminal xylenol linear tetranuclear compounds; 2,4-bis[2-hydroxy-3-(4-hydroxybenzyl)-5-methylbenzyl]-6-cyclohexylphenol, 2,4-bis[4-hydroxy-3-(4-hydroxybenzyl)-5-methylbenzyl]-6-cyclohexylphenol and other linear pentanuclear compounds and other linear polyphenolic compounds; bis[2-hydroxy-3-

(3,5-dimethyl-4-hydroxybenzyl)-5-methylphenyl]methane, bis[2-hydroxy-3-(2-hydroxy-5-methylbenzyl)-5-methylphenyl]methane, bis[4-hydroxy-3-(2-hydroxy-5-methylbenzyl)-5-methylphenyl]methane, bis[2,5-dimethyl-3-(4-hydroxy-5-methylbenzyl)-5-hydroxyphenyl]methane, bis[2,5-dimethyl-3-(4-hydroxybenzyl)-4-hydroxyphenyl]methane, bis[2,5-dimethyl-3-(2-hydroxybenzyl)4-hydroxyphenyl]methane and other linear tetranuclear compounds; 1,1-bis(4 hydroxyphenyl)-1-[4-(4-hydroxybenzyl)phenyl]ethane, 1,1-bis(3,5-dimethyl-4-hydroxyphenyl)-1-[4-(4-hydroxybenzyl)phenyl]ethane, 1,1-bis(3,5-dimethyl-2-hydroxyphenyl)-1-[4-(4-hydroxybenzyl)phenyl]ethane, 1,1-bis(4-hydroxy-3-methylphenyl)-1-[4-(4-hydroxybenzyl)phenyl]ethane, 1,1-bis(2,6-dimethyl-4-hydroxyphenyl)-1-[4-(4-(4-hydroxybenzyl)phenyl]ethane, 1,1-bis(3,4-dihydroxyphenyl)-1-[4-(4-hydroxybenzyl)phenyl]ethane, 1,1-bis(3,4,5-trihydroxyphenyl)-1-[4-(4-(4-hydroxybenzyl)phenyl]ethane, 1,1-bis(4-hydroxyphenyl)-1-[4-[1-(4-hydroxyphenyl)-1-methylethyl]phenyl]ethane, 1,1-bis(3,5-dimethyl-4-hydroxyphenyl)-1-[4-[1-(4-hydroxyphenyl)-1-methylethyl]phenyl]ethane, 1,1-bis(3,5-dimethyl-2-hydroxyphenyl)-1-[4-[1-(4-hydroxyphenyl)-methylethyl]phenyl]ethane, 1. 1-bis(4-hydroxy-3-methylphenyl)-1-[4-[1-(4-hydroxyphenyl)-1-methylethyl]phenyl]ethane, 1,1-bis(2,6-dimethyl-4-hydroxyphenyl)-1-[4-[1-(4-hydroxyphenyl-1-methylethyl]phenyl]ethane, 1,1-bis(3,4-dihydroxyphenyl)-1-[4-[1-(4-hydroxyphenyl)-1-methylethyl]phenyl]ethane, 1,1-bis(3,4,5-tihydroxyphenyl)-1-[4-(1-(4-hydroxyphenyl)-1-methylethyl]phenyl]ethane, and other non-linear tetranuclear compounds; bis(4-hydroxy-2,3,5-trimethylphenyl)-2-hydroxyphenylmethane, 1,4-bis[1-(3,5-dimethyl-4-hydroxyphenyl)isopropyl]benzene, 2,4-bis(3,5-dimethyl-4-hydroxyphenylmethyl)-6-methylphenol, bis(4-hydroxy-3,5-dimethylphenyl)-2-hydroxyphenylmethane, bis(4-hydroxy-2,5-dimethylphenyl-2-hydroxyphenylmethane, bis(4-hydroxy-3,5-dimethylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]4-[1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy-4-hydroxyphenylmethyl)pyrogallol, 4,6-bis(3,5-dimethyl-4-hydroxyphenylmethyl)pyrogallol, 2,6-bis(3-methyl-4-dihydroxyphenylmethyl)-4-methylphenol, 2,6-bis (2,3,4-trihydroxyphenylmethyl)-4-methylphenol, 1,1-bis(4-hydroxyphenyl)cyclohexane and other hydroxyaryls, and a compound represented by formula (I) or (II)

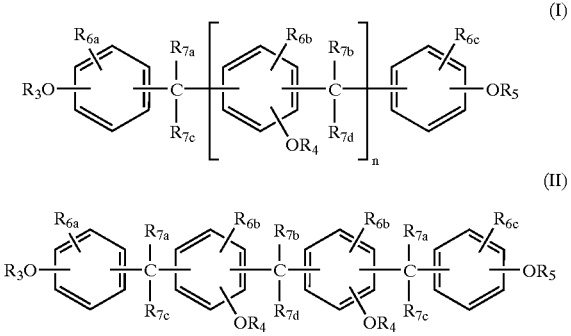

wherein $R_3$, $R_4$ and $R_5$ are independently selected form the group consisting of a hydrogen atom, a 1,2-naphthoquinonediazide-4-sulfonyl group, a 1,2-naphthoquinonediazide-5-sulfonyl group, a 7-methyl-1,2-naphthoquinonediazide-4-sulfonyl group, a 2,1-naphthoquinonediazide-4-sulfonyl group, a 2,1-naphthoquinonediazide-5-sulfonyl group; a 2,1-naphthoquinonediazide-6-sulfonyl group, a 2,1-naphthoquinonediazide-7-sulfonyl group, a 2,1-naphthoquinonediazide-8-sulfonyl group, and mixtures thereof, and $R_3$, $R_4$ and $R_5$, cannot be a hydrogen atom at the same time $R_{6a}$, $R_{6b}$, $R_{7a}$, $R_{7b}$, $R_{7c}$, and $R_{7d}$ are independently selected from a hydrogen atom or $c_{1-4}$ alkyl group, and n represents 1 or 2.

7. The composition of claim 6 wherein b) the photosensitive component group is selected from

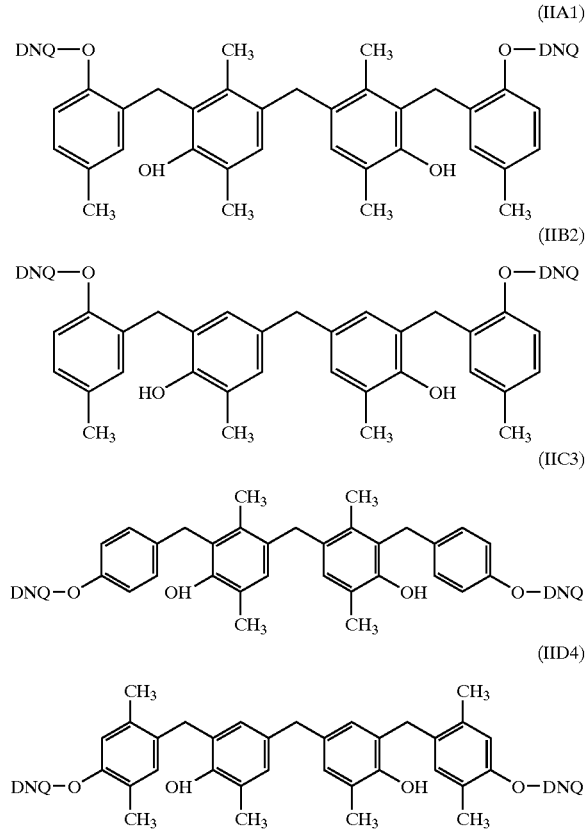

DNQ is 2,1-diazonaphthoquinone-5-sulfonyl-.

8. The composition of claim 1 wherein b) the photosensitive component group is present in a proportion of 2.5% to 15%, based on the weight of the partially esterified novolak resin.

9. The composition of claim 8 wherein the b) photosensitive component group is present in a proportion of 5% to 12%, based on the weight of the partially esterified novolak resin.

10. The composition of claim 1 wherein c) at least one solvent is selected from 2-heptanone, anisole, ethyl lactate, n-butyl acetate, propylene glycol methyl ether, propylene glycol methyl ether, ethyl 3-ethoxypropionate and mixtures thereof.

11. The composition of claim 10 wherein c) at least one solvent is a mixture of 2-heptanone and anisole.

12. The composition of claim 10 wherein c) at least one solvent is a mixture of ethyl lactate and with n-butyl acetate.

13. The composition of claim 10 wherein c) at least one solvent is a mixture of ethyl lactate and propylene glycol methyl ether.

14. The composition of claim 10 wherein c) at least one solvent is a mixture of propylene glycol methyl ether and ethyl 3-ethoxypropionate.

15. A process for preparing a composition comprising providing an admixture of: a) a film-forming novolak resin wherein the hydrogen atoms of hydroxyl groups in said novolak resin are substituted by a naphthoquinonediazidosulfonyl group in a proportion of less than 3.0 mol % per hydrogen atom to form a partially esterified novolak resin; b) at least one photosensitive component in an amount sufficient to photosensitize said photoresist composition; and c) at least one solvent.

16. A process for forming an image on a substrate comprising coating a substrate with a composition according to claim 1: imagewise exposing through a mask with ultraviolet radiation; and developing the exposed photoresist composition with a developer.

* * * * *